United States Patent
Horie et al.

(10) Patent No.: US 7,062,747 B2
(45) Date of Patent: Jun. 13, 2006

(54) METHOD AND APPARATUS FOR PREPAREING PATTERNS USED FOR MANUFACTURE OF SEMICONDUCTOR DEVICE

(75) Inventors: Yukisada Horie, Kasugai (JP); Takeo Moriyama, Kasugai (JP); Takashi Kurihara, Kasugai (JP); Ryo Shibata, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 277 days.

(21) Appl. No.: 10/330,307

(22) Filed: Dec. 30, 2002

(65) Prior Publication Data

US 2003/0163794 A1 Aug. 28, 2003

(30) Foreign Application Priority Data

Feb. 28, 2002 (JP) .............................. 2002-054084

(51) Int. Cl.
*G06F 17/50* (2006.01)
(52) U.S. Cl. .......................................... 716/19; 716/21
(58) Field of Classification Search ................ 716/1–4, 716/8–21
See application file for complete search history.

(56) References Cited

U.S. PATENT DOCUMENTS

| 6,467,070 B1 * | 10/2002 | Kuroda et al. ................. 716/8 |
| 6,574,789 B1 * | 6/2003 | Yamauchi .................... 716/21 |
| 6,694,500 B1 * | 2/2004 | Toyama ........................ 718/8 |
| 6,763,508 B1 * | 7/2004 | Igarashi et al. ................ 716/8 |
| 2002/0073391 A1 * | 6/2002 | Yamauchi et al. ............. 716/8 |
| 2003/0027058 A1 * | 2/2003 | Kato ............................ 430/5 |

* cited by examiner

*Primary Examiner*—Paul Dinh
*Assistant Examiner*—Binh Tat
(74) *Attorney, Agent, or Firm*—Staas & Halsey LLP

(57) ABSTRACT

A method of preparing layout data of patterns formed in a scribe area. First, library data on which a plurality of patterns and arrangement limiting conditions of each pattern and arrangement importance of each pattern are registered is prepared. A pattern to be arranged in the scribe area is selected from the library data. Then, the selected pattern in the scribe area is arranged in accordance with the arrangement limiting conditions and arrangement importance of the selected pattern. In this method, it is not necessary to prepare many arrangement models, so that preparing time of layout data is shortened.

20 Claims, 12 Drawing Sheets

Fig.4
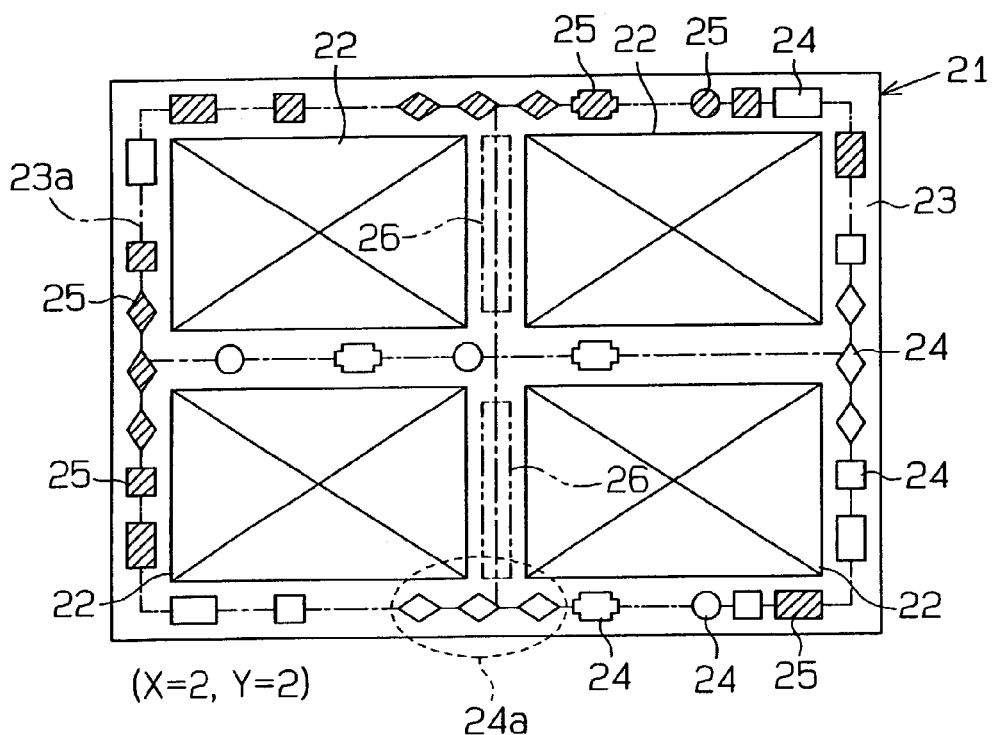

Fig.6

| Axis Code 1 | Axis Code 2 | Axis Code 3 | Place Code |
|---|---|---|---|
| Arrange On Outer Circumterential Axis | X Axis | Bottom Right | Align Left Align Bottom |
| Preferentially Arrange On Outer Circumterential Axis | Give Priority To X Axis | From Bottom To Top From Right To Left | Align Center |
| Arrange On Inner Axis | Y Axis | Top Left | Align Right Align Top |
| Preferentially Arrange On Inner Axis | Give Priority To Y Axis | From Top To Bottom From Left To Right | No Code |
| Upper Left Corner | No Code | From Center To Outside | |
| Upper Right Corner | | No Code | |
| Lower Left Corner | | | |
| Lower Right Corner | | | |
| 41 | 42 | 43 | 44 |

Fig.7

| Cell Name | AAA1 | AAA2 | BBB1 | BBB2 |
|---|---|---|---|---|
| Kind Of Group | AAB | AAB | BBA | BBA |
| Cell Forming Axis | X | X | Y | Y |
| Cell Size | 1000 | 1000 | 1000 | 1000 |
| Cell Width | 100 | 100 | 100 | 100 |
| Gap With Other Cells | 10 | 10 | 10 | 10 |
| Gap In Group Arrangement | 10 | 10 | 1000 | 10000 |
| Importance | 1 | 2 | 3 | 4 |
| Spec Down Information | Targeted Cell Name | Targeted Cell Name | Targeted Cell Name | — |

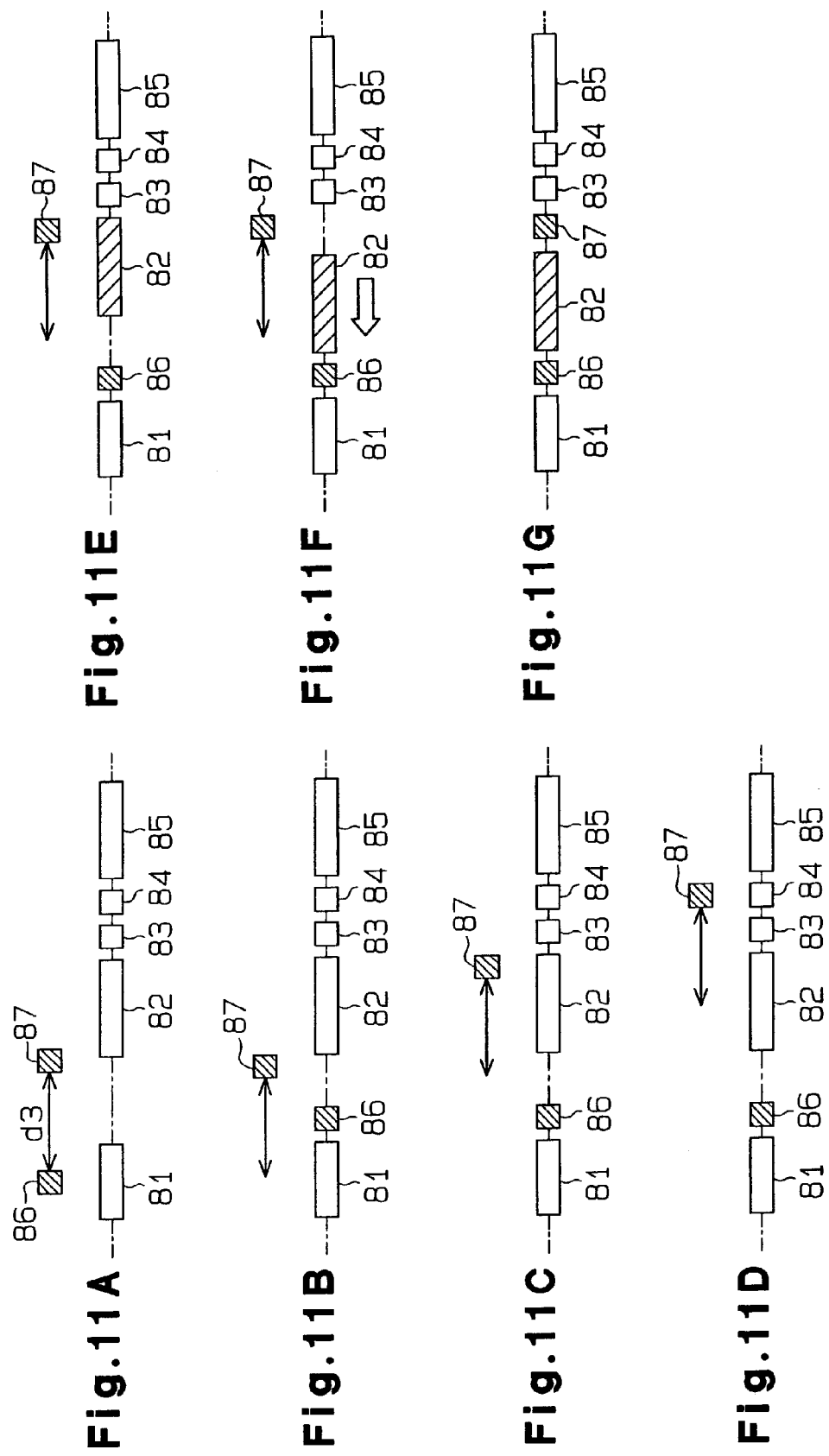

Fig.14

| Patterns | Exposure Device A | Exposure Device B |
|---|---|---|
| (a) | ○ ○   △ △ | □ □   ◇ ◇ |
| (b) | ○ ○ | □ □   ◇ ◇ |
| (c) | △ △ | □ □   ◇ ◇ |
| (d) | ○ ○   △ △ | □ □ |
| (e) | ○ ○   △ △ | ◇ ◇ |
| (f) | ○ ○ | ◇ ◇ |
| (g) | △ △ | □ □ |

METHOD AND APPARATUS FOR PREPAREING PATTERNS USED FOR MANUFACTURE OF SEMICONDUCTOR DEVICE

CROSS-REFERENCE TO RELATED APPLICATIONS

This application is based upon and claims the benefit of priority from the prior Japanese Patent Application No. 2002-054084, filed on Feb. 28, 2002, the entire contents of which are incorporated herein by reference.

BACKGROUND OF THE INVENTION

The present invention relates to a method and apparatus for preparing patterns, and more particularly, it relates to a method and apparatus for preparing layout data of process patterns formed in a scribe area of a photomask.

In a manufacturing process of a semiconductor device such as an LSI, a wafer substrate is repeatedly applied to transferring, development and etching of circuit patterns utilizing photolithography, and thus a great number of semiconductor chips are formed on the wafer substrate.

In the transferring of the circuit patterns, an exposure device (stepper device) is used to repeatedly perform reduced projection of the patterns formed in the photomask to the wafer substrate. Then, scribe areas are defined between the semiconductor chips on the wafer substrate, and the wafer substrate is diced along the scribe areas, thereby making it possible to obtain individual semiconductor chips.

Various kinds of process patterns and monitor circuits are formed in the scribe areas of the wafer substrate, in the manufacturing process of the LSI. The process patterns include an alignment pattern, a displacement check pattern and a monitor pattern. The alignment pattern is used to align the photomask and the wafer substrate. The displacement check pattern is used to measure transferring results. The monitor pattern is used to check the state of chips in every process such as the etching and chemical mechanical polishing (CMP).

The stepper devices of a plurality of manufacturers are used in production lines of the semiconductor device, for such a purpose as stable operation. In this case, the process patterns differ depending upon each stepper device. Therefore, it is preferable that one photomask is shared by a plurality of stepper devices in reducing the producing costs and shortening the producing time of the photomask. In this case, a photomask having plural kinds of process patterns is needed.

The monitor circuit is used to check the operation of various function elements in a chip by electrically monitoring the circuits in the chip after a wafer process is finished. The operation of the circuits in the chip is preferably checked by a test, however, if a test pattern thereof is formed in the chip, not only the circuit becomes complicated, but also the testing cost is increased. Therefore, the operation of the circuits in the chip is analogized by forming a simple circuit for the circuits in the chip within the monitor circuit and performing an operational test of the circuit. Consequently, it is necessary to form plural kinds of monitor circuits in the scribe area, to ensure that the operation of the circuits in the chip is monitored.

In this way, various process patterns and monitor circuits are formed in the scribe area on the wafer substrate. Therefore, in preparing the photomask, it is necessary to take the positions of arranging the monitor circuits into account so that the process patterns and the monitor circuits will not be arranged in a way to overlap each other in the scribe area when layout data (also referred to as frame data) of the process patterns for manufacturing the LSI is produced.

Conventionally, the photomask is manufactured in accordance with the chip size of a main device and the number of layouts of the main device. At this point, marks (alignment mark, displacement check mark and monitor mark) indicating the process patterns of each kind are arranged in the scribe areas of the photomask.

The process patterns are used for the alignment, checking, measurement and the like in various processes such as a wafer process, testing process and assembly process (mainly dicing). Therefore, arrangement conditions of each mark are set in accordance with uses in each process. Further, various arrangement models are prepared considering the arrangement conditions and the number of layouts on the photomask, and the process patterns are selected and arranged on the basis of the arrangement models.

FIG. 1 is a flowchart showing the process of preparing the layout data of the process patterns in accordance with a conventional pattern preparing apparatus.

First, a plurality of arrangement models are prepared, in which the arrangement positions of the process patterns are patterned on the basis of the arrangement conditions and the number of layouts on the photomask that are previously assumed (step S100). Then, arrangement model libraries 100 collecting a plurality of arrangement models are prepared. The arrangement model libraries 100 are stored in a storage device of the pattern preparing apparatus. Normally, the process of preparing arrangement models (step S100) is mainly performed when the layout data is prepared in accordance with a new design rule as opposed to a design rule of the manufacturing process.

The pattern preparing apparatus receives processing conditions necessary to arrange the process patterns (step S101). The processing conditions include the chip size, the number of layouts of chips and the arrangement conditions of the process patterns, for example.

Next, the pattern preparing apparatus selects an arrangement model for the process pattern in accordance with the processing conditions from the arrangement model libraries 100 (step S102).

The pattern preparing apparatus determines whether an arrangement model suitable for the processing conditions exists in the arrangement models registered in the arrangement model libraries 100 (step S103). If an arrangement model suitable for the processing conditions exists, the pattern preparing apparatus calculates a coordinate value indicating the arrangement position of the process pattern in the scribe area using the selected arrangement model (step S104), and prepares the layout data of the process pattern in accordance with the coordinate value (step S105).

If an arrangement model suitable for the processing conditions does not exist, the pattern preparing apparatus extracts an arrangement model similar to the suitable arrangement model (similar model) from the arrangement model libraries 100 (step S106). The pattern preparing apparatus prepares layout data on the basis of the similar model, and checks the layout data (step S107). After checking, the pattern preparing apparatus corrects the layout data as needed (step S108).

Meanwhile, a plurality of arrangement models registered in the arrangement model libraries 100 is prepared by an operator by hand assuming various processing conditions (chip size, the number of layouts, and arrangement conditions of the process patterns) at the time of preparing the layout data. As a consequence, a considerable amount of time has been required to prepare many arrangement models available at the time of preparing the layout data.

Especially, notable progress is made in a recent process technology, and the number of process patterns arranged in the scribe area is increasing drastically. Consequently, it is extremely difficult to prepare all arrangement models suitable for the processing conditions of preparing the layout data. Therefore, in the case of preparing layout data that fulfills the processing conditions for which arrangement models are not prepared, it is difficult to arrange the process patterns while effectively utilizing the scribe area.

As the number of monitor circuits arranged in the scribe area is also increasing drastically, it has been extremely difficult to arrange the process patterns while preventing the process patterns from overlapping the monitor circuits. For this reason, automatic arrangement by the pattern preparing apparatus utilizing the arrangement models is not successful in some cases. In this case, the operator needs to correct the arrangement of the process patterns by hand, which, as a result, has increased the time to prepare the layout data. When the arrangement of the process patterns is corrected by hand in such a manner, it is very likely to cause mistakes such as the overlapping of patterns, so that many processes may be performed to eliminate the overlapping. As a result, the patterns can not be properly arranged in some cases.

SUMMARY OF THE INVENTION

In a first aspect of the present invention, a method of preparing layout data of patterns formed in a scribe area is provided. The method includes the steps of preparing library data on which a plurality of patterns and arrangement-related information of each pattern are registered, selecting a pattern to be arranged in the scribe area from the library data, and arranging the selected pattern in the scribe area, in accordance with the arrangement-related information of the selected pattern.

In a second aspect of the present invention, a program for preparing layout data of patterns formed in a scribe area is provided. The program causing a processing unit to execute the steps of preparing library data on which a plurality of patterns and arrangement-related information of each pattern are registered, selecting a pattern to be arranged in the scribe area from the library data, and arranging the selected pattern in the scribe area, in accordance with the arrangement-related information of the selected pattern.

In a third aspect of the present invention, an apparatus for preparing layout data of patterns formed in a scribe area is provided. The apparatus includes a processing unit for preparing library data on which a plurality of patterns and arrangement-related information of each pattern are registered. A memory unit coupled to the processing unit for storing the library data. The processing unit selects a pattern to be arranged in the scribe area from the library data and arranges the selected pattern in the scribe area, in accordance with the arrangement-related information of the selected pattern.

In a fourth aspect of the present invention, a method for preparing a photomask used in exposure of patterns is provided. The method includes the steps of preparing library data on which a plurality of patterns and arrangement-related information of each pattern are registered, selecting patterns to be arranged in the scribe area from the library data, arranging the selected patterns in the scribe area to prepare layout data, in accordance with the arrangement-related information of the selected pattern, and preparing the photomask using the layout data.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 4 is a diagram showing a pattern arrangement of layout data of a process pattern prepared by the pattern preparing apparatus of FIG. 2;

FIG. 6 is a diagram showing an example of arrangement limiting conditions of cells (process patterns);

FIG. 7 is a diagram showing an example of cell attribution;

FIGS. 11A to 11G are diagrams for describing the embedding processing by the moving of the already-arranged pattern;

FIG. 14 is a diagram for describing the spec down processing of a pattern size in accordance with the exposure devices of FIG. 13.

DETAILED DESCRIPTION OF THE PREFERRED EMBODIMENTS

Figure 1:
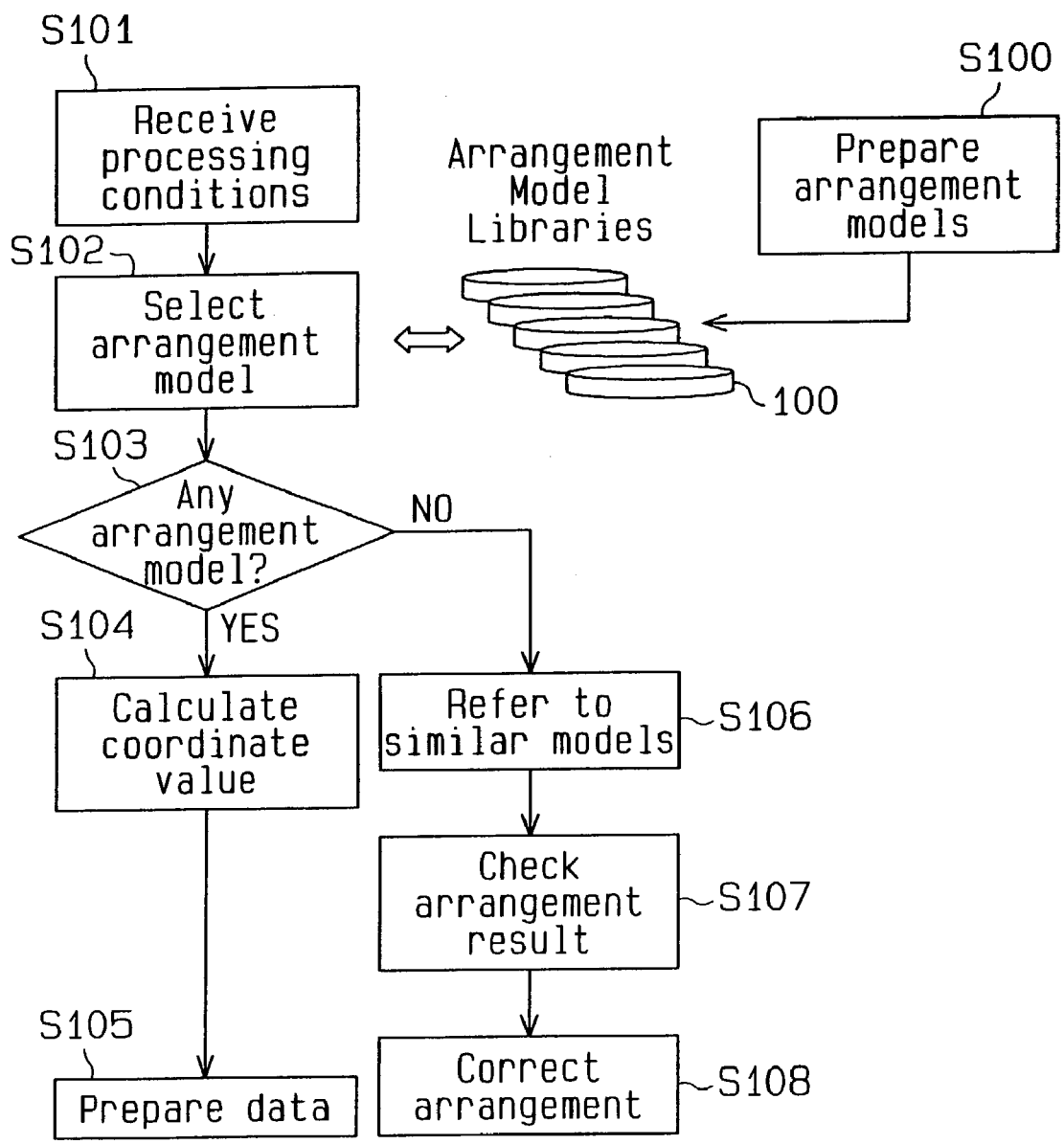
FIG. 1 is a flowchart showing conventional pattern preparation processing.

In the drawings, like numerals are used for like elements throughout.

Hereinafter, a pattern preparing apparatus 11 in one embodiment of the present invention will be described with reference to FIGS. 2 to 14.

Figure 2:
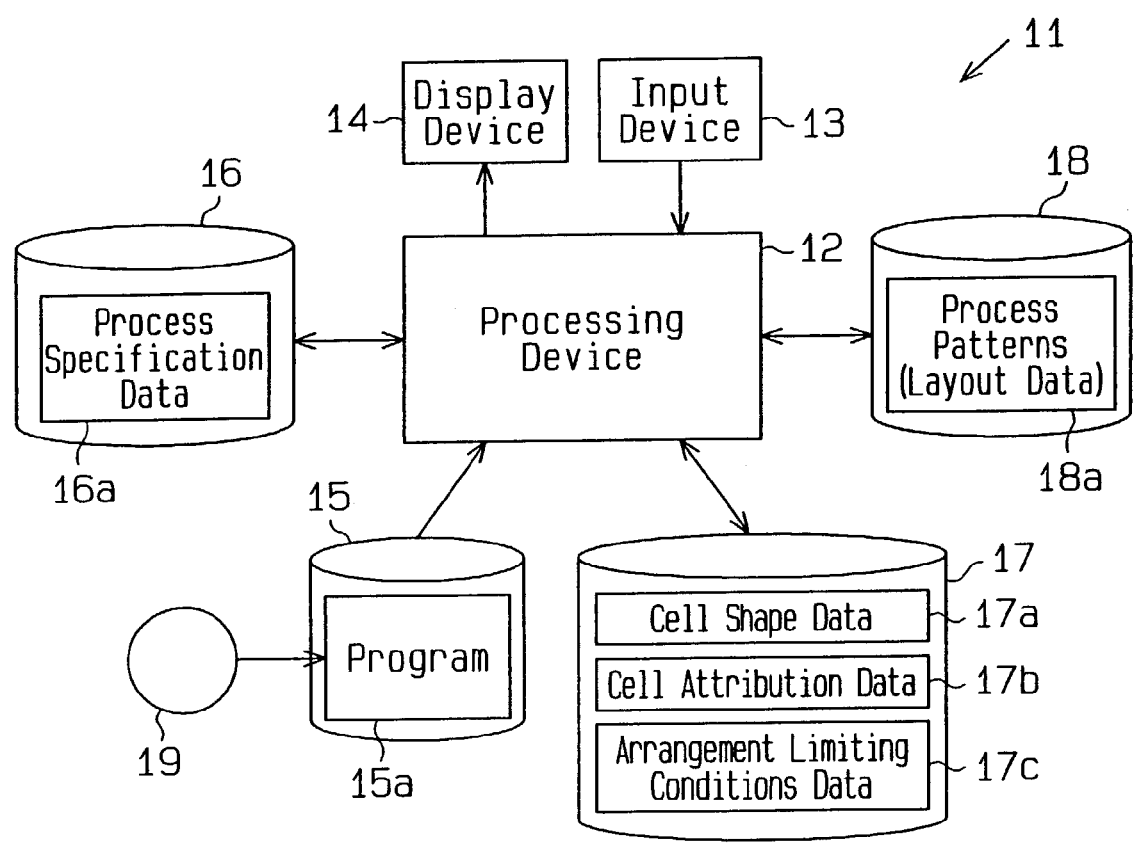
FIG. 2 is a schematic block diagram of a pattern preparing apparatus in accordance with one embodiment of the present invention.

As shown in FIG. 2, the pattern preparing apparatus 11 is a computer aided design (CAD) apparatus, and includes a processing device 12, and an input device 13, a display device 14 and four storage devices 15 to 18 that are each connected to the processing device 12.

The input device 13 includes a keyboard and a mouse device (not shown), and is used for starting programs, and input of demands and instructions from a user, and parameters.

The display device 14 includes a monitor (not shown) such as a cathode ray tube (CRT), a liquid crystal display (LCD) and a plasma display panel (PDP), and an output device such as a printer (not shown), and the display device 14 is used to display the processing results of layout data preparation and a parameter input screen.

A magnetic disk device, an optical disk device or a magnet-optical disk device (not shown) can be used for each of the storage devices 15 to 18, and any of the storage devices is suitably selected depending upon the kind and condition of data to be stored. Although each of the storage devices 15 to 18 is provided separately so as to store corresponding data, plural kinds of data may be stored in a single storage device. Alternatively, various kinds of data may be divided and stored in a plurality of storage devices.

The first storage device 15 stores a program data 15a for performing layout data preparation processing. The program 15a is recorded on a recording medium 19. The processing device 12 drives an unillustrated driving device in response to the instruction by the input device 13, and loads the program 15a recorded on the recording medium 19 into the first storage device 15, and then performs processing necessary to prepare the layout data of the process patterns in accordance with the program. The processing device 12 may directly receive the program 15a recorded on the recording medium 19 and execute the program.

For the recording medium 19, it is possible to use an arbitrary recording medium that can be read by a computer, such as a memory card, a flexible disk, an optical disk (CD-ROM, DVD-ROM, etc.) or a magnet-optical disk (MO, MD, etc.) (not shown). The recording medium 19 also includes a recording medium in which the program 15a uploaded or downloaded by way of communication media is recorded and a recording medium in which the program 15a that can directly be executed by a disk device or the processing device 12 is recorded.

The second storage device 16 stores a process specification data 16a. The process specification data 16a includes various kinds of processing conditions necessary to prepare the layout data for preparing the photomask used at the time of manufacturing the LSI. The processing conditions are information necessary to arrange the process patterns, and include the size of a chip formed on the wafer substrate, layout constitution (the number of layouts) of the photomask and selecting conditions of the process patterns, for example.

The third storage device 17 stores a cell shape data 17a, a cell attribution data 17b and an arrangement limiting conditions data 17c that are each made into a form of library.

The cell shape data 17a is prepared by putting the process patterns formed in accordance with a design rule into a cell form for preparing the layout data. Each cell is a single cell constituted of one process pattern or a group cell constituted of a plurality of process patterns. Each cell is indicated by a mark that corresponds to the kind of process pattern.

The process pattern includes an alignment pattern used to align the photomask and the wafer substrate, a displacement check pattern used to measure transferring results, and a monitor pattern used to check the state of a process such as etching/CMP. The alignment pattern is indicated by an alignment mark, the displacement check pattern is indicated by a displacement check mark, and the monitor pattern is indicated by a monitor mark.

The cell attribution data 17b includes information indicating the cell attribution. The cell attribution includes parameters regarding arrangement attribution (size of a cell, an arrangement space between the cell and other cells), importance of arrangement, and spec down processing of each cell in the scribe area.

The arrangement limiting conditions data 17c includes information indicating the arrangement limiting conditions of each cell in the scribe area. The arrangement limiting conditions include a parameter of an axis at the time of arranging cells in the scribe area and a parameter of an arranging place in the axis, and the arrangement limiting conditions are set for every parameter.

The fourth storage device 18 stores a layout data 18a of the process patterns prepared on the basis of the process specification data 16a, the cell shape data 17a, the cell attribution data 17b and the arrangement limiting conditions data 17c. The processing device 12 executes the program 15a and performs the pattern preparation processing to prepare the layout data 18a, and stores the layout data 18a in the fourth storage device 18.

Figure 3:
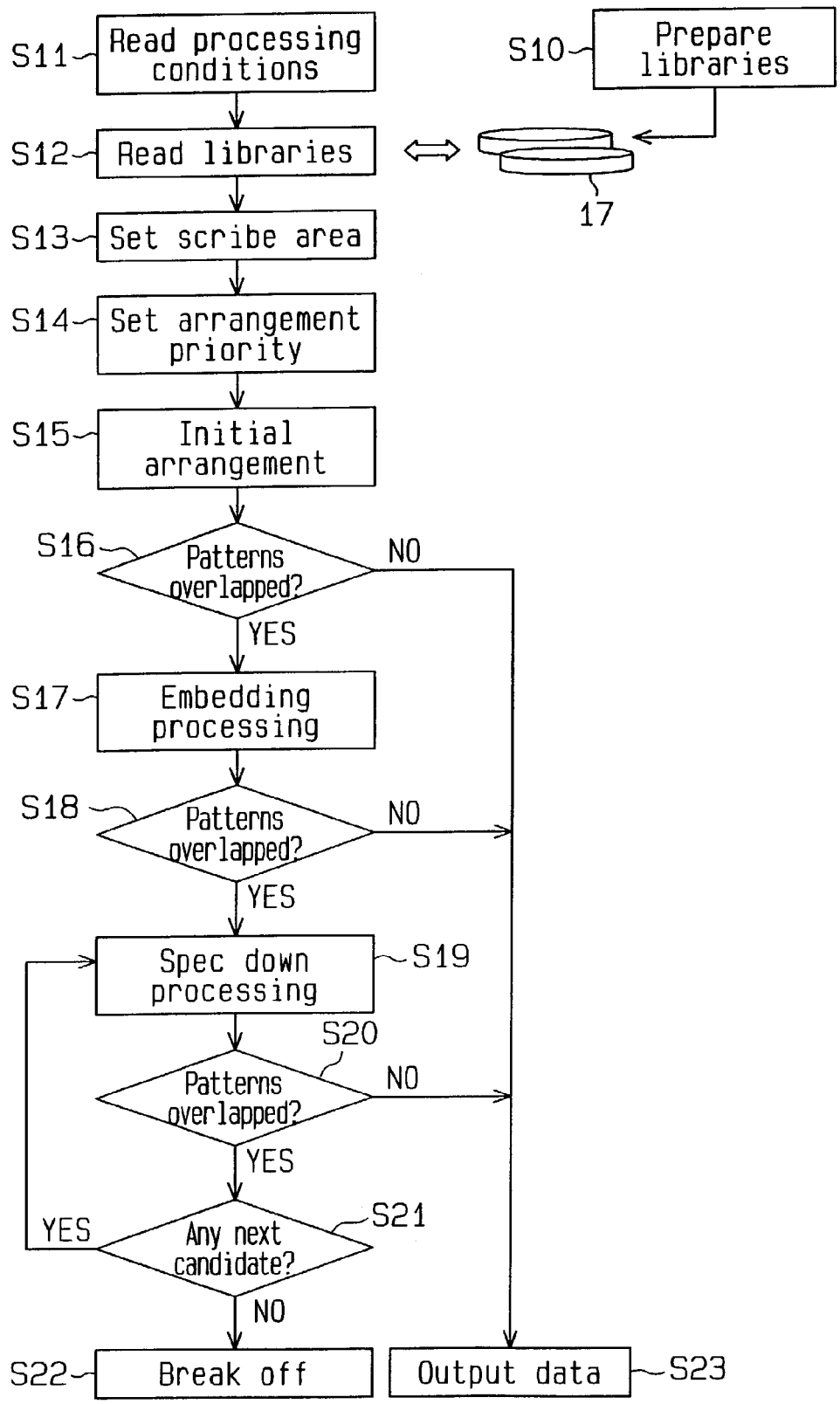
FIG. 3 is a flowchart showing the processing of the pattern preparing apparatus of FIG. 2.

FIG. 3 is a flowchart showing layout data preparation processing (hereinafter, pattern preparation processing) of the process patterns by the pattern preparing apparatus 11.

In preparing the layout data, libraries of the cell shape data 17a, the cell attribution data 17b and the arrangement limiting conditions data 17c are prepared (step S10), and each library is stored in the third storage device 17 of the pattern preparing apparatus 11. Normally, the library preparation processing (step S10) is performed when new layout data is prepared in response to a change of the design rule of the chip size, the number of layouts and a manufacturing process.

First, the processing device 12 of the pattern preparing apparatus 11 reads the processing conditions (chip size, layout constitution and pattern selection conditions, etc.) necessary to arrange the process patterns, from the process specification data 16a stored in the second storage device 16 (step S11).

Next, the processing device 12 selects the cell shape data 17a, the cell attribution data 17b and the arrangement limiting conditions data 17c that fulfill the processing conditions, from the libraries stored in the third storage device 17, and reads the data (step S12). In step S12, the cells to be arranged in the scribe area, the cell attribution of the cells and the arrangement limiting conditions are taken in.

The processing device 12 sets arrangement areas for the process patterns in the scribe area on the basis of the processing conditions and various kinds of data read in steps S11 and S12 (step S13). In step S13, arrangement prohibited areas of the process patterns in the scribe area are also set, in order to prevent the overlapping with the monitor circuits for operation checking arranged in the scribe area.

Next, the processing device 12 sets arrangement priority (arrangement order) of the cells arranged in the scribe area. The arrangement priority is decided on the basis of the cell attribution data 17b and the arrangement limiting conditions data 17c (concretely, arrangement importance and arrangement limiting conditions that will be described later).

Next, the processing device 12 initially arranges the cells in the scribe area in accordance with the arrangement priority (step S15).

Specifically, the processing device 12 sequentially arranges the cells in accordance with the arrangement priority, and checks the arrangement position every time a cell is arranged. This checking includes checking whether or not the arrangement position is in breach of the arrangement limiting conditions and the arrangement conditions in a state where a shot in the exposure device is stepped over, and checking whether or not a cell is arranged in the arrangement prohibited areas of the process patterns. In this way, when any one of the conditions is found to be breached as a result of checking the arrangement positions of the cells, the processing device 12 changes the arrangement priority of the cell to a lowest rank, and performs initial arrangement of other cells. In other words, the initial arrangement is not performed for the cells that breach the conditions.

The processing device 12 determines whether or not the patterns are overlapped as a result of the initial arrangement (i.e., whether or not all the cells could be arranged by the initial arrangement) (step S16). At this point, if no overlapping of the patterns is found, the processing device 12 outputs the layout data prepared by the initial arrangement (step S23). On the contrary, if the overlapping of the patterns is found, the processing device 12 performs embedding processing (step S17).

In the embedding processing, the processing device 12 moves or divides (in the case of the group cells only) the cells having already been arranged (hereinafter, referred to as already-arranged cells) to prepare arrangement areas (free areas) for the cells that could not be arranged (hereinafter, referred to as unarranged cells) in the scribe area, and arranges the unarranged cells. The embedding processing is also performed to effectively arrange the patterns in the scribe area by moving or dividing the cells once arranged. This kind of embedding processing (moving or dividing of the cells) is performed on the basis of the arrangement limiting conditions.

The processing device 12 determines whether or not the patterns are overlapped (i.e., whether or not all the unarranged cells could be arranged by the embedding processing) as a result of the embedding processing (step S18). If no overlapping of the patterns is found, the processing device 12 outputs the layout data prepared by the embedding processing (step S23). On the contrary, if the overlapping of the patterns is found, the processing device 12 performs the spec down processing (step S19).

In the spec down processing, the processing device 12 replaces the cells that could not be arranged even by the embedding processing with other cells with different conditions in accordance with a predetermined order of priority, or changes the arrangement positions of the cells to other arrangement positions with different arrangement limiting conditions in accordance with the order of priority. Specifically, in the spec down processing, the cells that could not be arranged are replaced with cells that have less freedom in selecting the device and the manufacturing process, or the arrangement positions of the cells are changed to arrangement positions with acceptable alignment accuracy.

As to the spec down processing, such cells are set highest in the order of priority as those that have the pattern shape or arrangement position usable in every device (exposure device) and manufacturing process, or those that have the pattern shape or arrangement position capable of obtaining the highest alignment accuracy. On the contrary, such cells are set low in the order of priority as those that can be used only in a particular exposure device and manufacturing process, or those that have low alignment accuracy. The order of priority is set on the basis of the kind of process pattern (alignment pattern, displacement check pattern and monitor pattern).

According to the order of priority set in this way, the processing device 12 changes the cell that could not be arranged to a cell one step lower in the order of priority, if the overlapping of the cells is caused. In addition, the order of priority of each cell initially arranged in step S15 is the highest.

The processing device 12 determines whether or not the patterns are overlapped (i.e., whether or not all the unarranged cells have been arranged by the spec down processing) as a result of the spec down processing (step S20). If no overlapping of the patterns is found, the processing device 12 outputs the layout data prepared by the spec down processing (step S23). If the overlapping of the patterns is found, the processing device 12 determines whether or not the cell of a next candidate to once again apply the spec down processing is found (step S21). If no cell of the next candidate (i.e., the cell one step lower in the order of priority) is found, the processing device 12 breaks off the layout data preparation processing (step S22). If the cell of the next candidate is found, the processing device 12 returns to step S19 and once again performs the spec down processing.

The processing device 12 again determines whether or not the patterns are overlapped as a result of the second spec down processing and outputs the layout data if no overlapping of the patterns is found. The processing device 12 once again determines whether or not there is a cell of the next candidate for the spec down processing if the overlapping of the patterns is found.

The processing device 12 repeatedly performs the spec down processing until no overlapping of the patterns is found, and prepares the layout data. If the overlapping of the patterns is still found but no more cell of the next candidate for the spec down processing is found, the processing device 12 breaks off the processing. When no cell targeted for the spec down processing is set in the first spec down processing after the embedding processing, the processing device 12 breaks off the processing.

Figure 5:
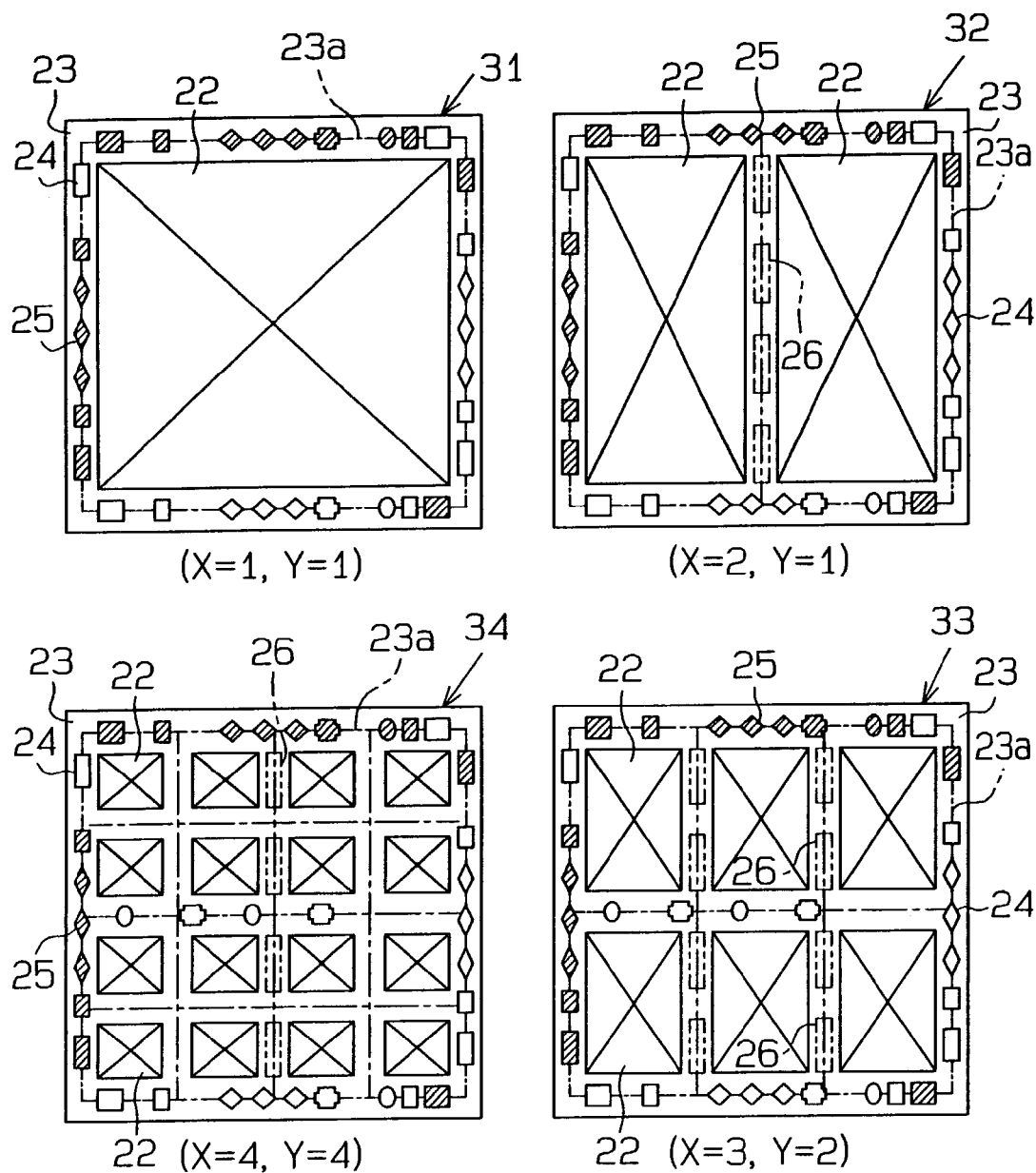
FIG. 5 is a diagram showing the pattern arrangements of other layout data in accordance with layout constitution of a photomask.

The patterns based on the layout data prepared in the pattern preparation processing of FIG. 3 are shown, for example, in FIG. 4 and FIG. 5.

A photomask 21 whose number of layouts is four (expressed by X=2, Y=2), for example, is shown in FIG. 4. The photomask 21 includes chip areas 22 for forming the semiconductor chips on the wafer substrate, and a scribe area 23. The wafer substrate is diced along a scribe line 23*a* (indicated by a dash and dotted line in FIG. 4), and divided into each chip.

Device patterns (not shown) for forming the semiconductor chips are formed in the chip areas 22, and process patterns 24, light shielding bands 25 and monitor circuits 26 are arranged on the scribe line 23*a* in the scribe area 23 with marks corresponding to their kinds.

The process patterns 24 include the alignment pattern, displacement check pattern and monitor pattern each arranged in a way to be identified by inherent marks. The process patterns 24 are treated as cells at the time of preparing the layout data, and the distance between the adjacent cells is kept to a minimum distance in principle. Further, in a group cell 24*a* constituted of a plurality of process patterns 24, an arrangement order and the minimum distance in the group are set for every group cell 24*a* in some cases.

The light shielding bands 25 are used to prevent multiple exposure between shots at the time of exposure, and disposed on the sides opposite to outer circumferential axes (four sides) of the photomask 21 where the process patterns 24 are arranged.

The monitor circuits 26 are used to check the operation of the function elements formed in the chip areas 22 on the wafer substrate after the wafer process is finished. The arrangement areas of the monitor circuits 26 correspond to the arrangement prohibited areas of the process patterns 24.

As shown in FIG. 5, the layout data is prepared in accordance with the layout constitution of the photomask. FIG. 5 shows a photomask 31 whose number of layouts is one (X=1, Y=1), a photomask 32 whose number of layouts is two (X=2, Y=1), a photomask 33 whose number of layouts is six (X=3, Y=2) and a photomask 34 whose number of layouts is sixteen (X=4, Y=4).

As shown in FIG. 6, the arrangement limiting conditions data 17c include two axis codes (shown by axis codes 1 to 3 in FIG. 6) 41 to 43 and a place code 44 by which the arrangement limiting conditions of the cells (single cell or group cell) are set.

Each of the axis codes 41 to 43 indicates the axis where the cells are to be arranged in the scribe area. The place code 44 indicates the place where a cell is arranged within the axis. Various kinds of arrangement limiting conditions are set for each of these codes 41 to 44. Therefore, the arrangement limiting conditions of each cell are decided by the combination of the three axis codes 41 to 43 and the place code 44.

For example, as to the group cell 24a of the photomask 21 in FIG. 4, arrangement limiting conditions "first axis code 41: arrange on outer circumferential axis, second axis code 42: X axis, third axis code 43: bottom, place code 44: align center."

"Upper left corner", "upper right corner", "lower left corner" and "lower right corner" in the first axis code 41 of FIG. 6 are the arrangement limiting conditions set for a specific kind of cell (process pattern). When these arrangement limiting conditions are set, each of the axis codes 42, 43 and the place code 44 is set as "no code".

The arrangement limiting conditions include the priority of the arrangement positions for the cells whose arrangement positions can be changed in the scribe area. When the priority is set, the cells are arranged in the arrangement positions beginning from the arrangement position whose priority is high. For example, if the first axis code 41 is set as "preferentially arrange on outer circumferential axis", the cell is most desirably arranged on the outer circumferential axis in the scribe area. However, when the cell can not be arranged on the outer circumferential axis due to the overlapping of the patterns, the cell can also be arranged on an inner side axis. Such priority can also be set for each of the axis codes 42, 43 and the place code 44. In the third axis code 43 and the place code 44, upper sections indicate the priority at the time of arranging on the X axis, and lower sections indicate the priority at the time of arranging on the Y axis.

Since the "upper left corner" of the first axis code 41 limits the arrangement position of the cell to one place, the arrangement limit is strict. On the contrary, when the priority is set, the arrangement limit is relatively reduced since the arrangement position is changeable. When the priority of the arrangement limiting conditions is set, the embedding processing of the cells is performed in accordance with the priority.

As shown in FIG. 7, the cell attribution (e.g., the cell attribution data 17b) includes a plurality of item data indicating an arrangement attribution 51 of each cell (group cell in FIG. 7), arrangement importance 52, and spec down information 53.

The arrangement attribution 51 includes a group kind, a cell forming axis, the size of a cell, the width of a cell, a gap (GAP) between adjacent cells, and a gap in a group.

The group kind indicates the kind of process patterns constituting the group cell. For example, cell names "AAA1" and "AAA2" shown in FIG. 7 have the same process pattern constitution ("AAB"). The cell forming axis indicates whether a cell is prepared on the basis of the X axis or Y axis. The size of a cell (i.e., axial length) and the width of a cell indicate the length of the arrangement area of the cell. The gap between adjacent cells indicates the arrangement space to be kept between adjacent cells. The gap in a group indicates an arrangement space to be kept between the process patterns of the group cell.

The arrangement importance 52 is referred when the arrangement priority is set and the order of priority related to the spec down processing is set. In other words, the arrangement priority and the order of priority of the spec down processing are decided considering how high the arrangement importance 52 is and how much freedom is permitted in the arrangement limiting conditions.

The spec down information 53 includes information about the first priority at the spec down processing and the name of a cell targeted for a next candidate. The spec down processing is not performed for the cells (e.g., cell name "BBB2") related to the spec down information 53 which does not include the name of the targeted cells.

Next, a checking method of the arrangement conditions considering the arrangement state (hereinafter, shot overlapped state) of the process patterns between shots by the exposure device will be described with reference to FIG. 8 and FIG. 9.

Figure 8:
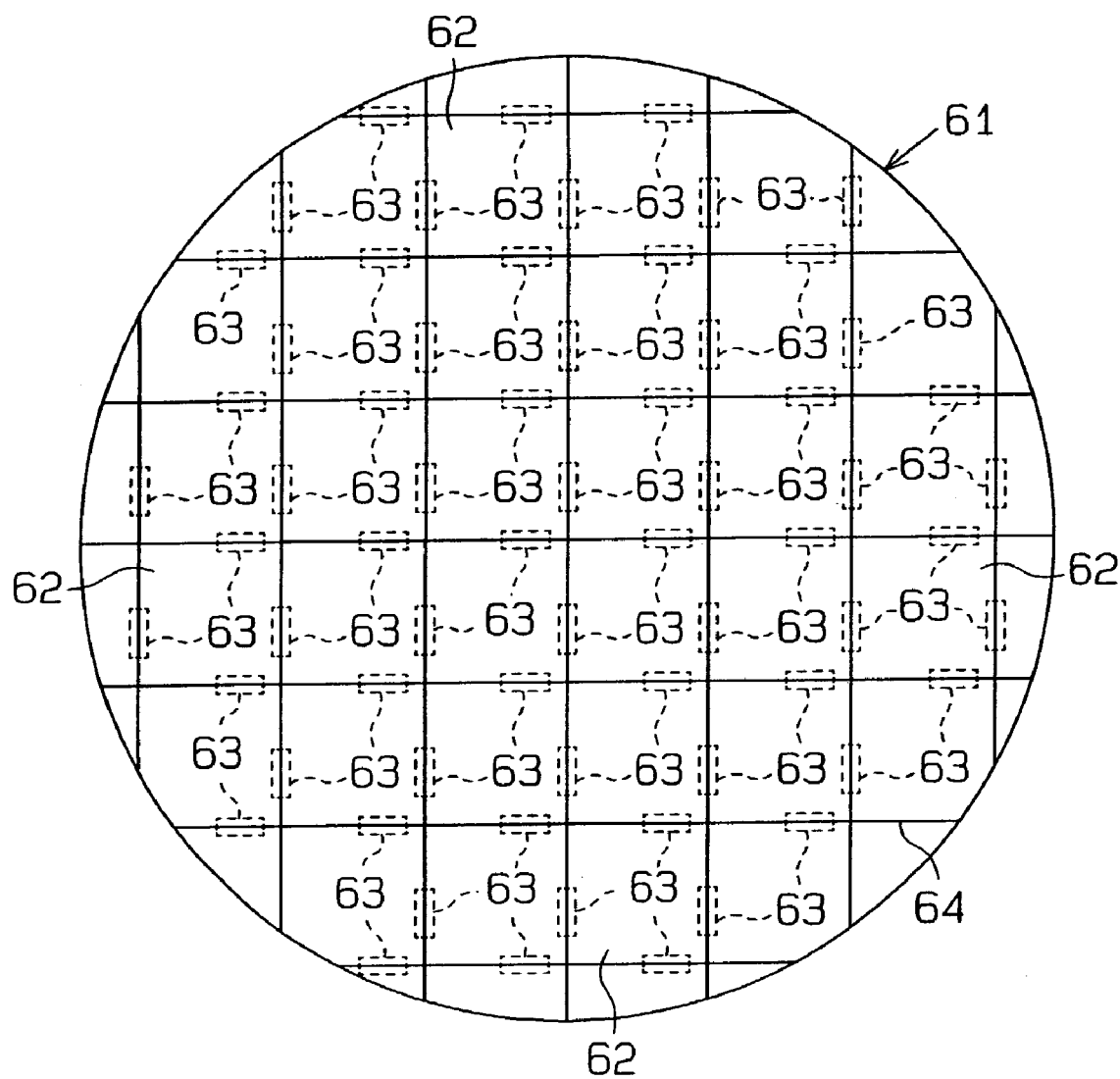
FIG. 8 is a schematic plane view of a wafer substrate on which the patterns are exposed.

FIG. 8 shows a wafer substrate 61 after exposure processing, and a plurality of semiconductor chips 62 are formed in a plurality of chip areas of the wafer substrate 61. Various kinds of process patterns 63 and monitor circuits (not shown) are formed in the scribe areas (not shown) on the wafer substrate 61. Each semiconductor chip 62 is separated along scribe lines 64.

The process patterns 63 are formed such that an unillustrated exposure device (stepper device) moves the wafer substrate 61 with respect to the photomask shot by shot. Therefore, it is necessary to prepare the layout data of the process patterns 63 taking the shot overlapping state into account.

Figure 9A:
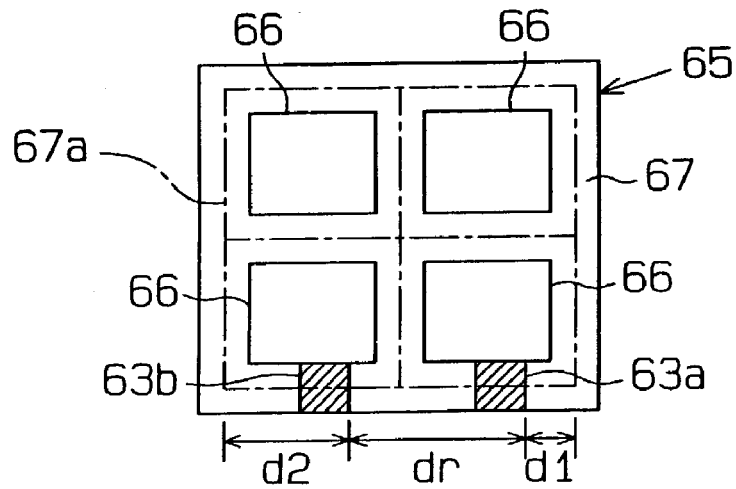
FIG. 9A is a diagram showing the pattern arrangement of the layout data of the photomask.

As shown in FIG. 9A, for example, a photomask 65 to be exposed corresponding to the number of layouts "4" has four chip areas 66 and a scribe area 67. Process patterns 63a and 63b are formed on a scribe line 67a of the scribe area 67. For easy understanding of the description, only the two process patterns 63a and 63b are shown which are formed on the X axis (outer circumferential axis) in the scribe area of the photomask 65.

An arrangement space dr of the two adjacent process patterns 63a and 63b is set to keep at least a predetermined arrangement space dg (minimum space). A space dl between the right end of the process pattern 63a and the scribe line 67a at the right end, and a space d2 between the left end of the process pattern 63b and the scribe line 67a at the left end are set to be dg/2 or more.

Figure 9B:
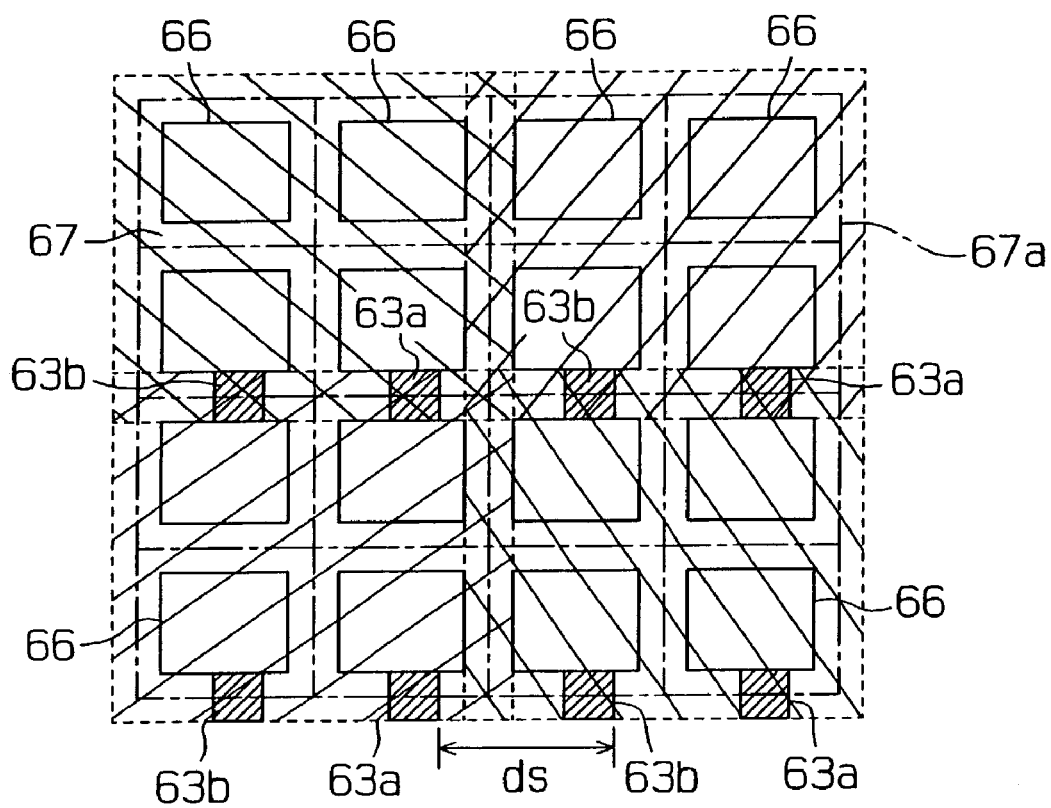
FIG. 9B is a diagram showing exposure processing that uses the photomask of FIG. 9A.

As shown in FIG. 9B, when, for example, exposure of four shots is performed using the photomask 65, the arrangement space of the two adjacent process patterns 63a and 63b is ds, in a state where a lower left shot and an upper right shot are partially overlapped. The arrangement space ds is d1+d2. Therefore, the arrangement space ds in the state where the shots are overlapped satisfies at least an arrangement space dg. The checking of the arrangement conditions in such a state where the shots are overlapped is done in the processing of preparing the layout data (see FIG. 3), and a plurality of process patterns 63 is formed on the wafer substrate 61 after the exposure in the arrangement positions that do not breach the arrangement conditions.

Next, the embedding processing will be described. First, the embedding processing by the division of the already-arranged cells (already-arranged patterns) will be described.

Figure 10A:
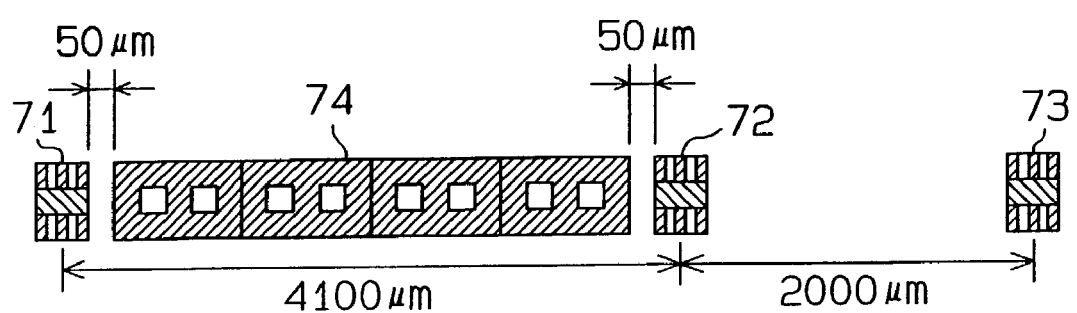
FIGS. 10A and 10B are diagrams for describing embedding processing by the division of an already-arranged pattern.

As shown in FIG. 10A, cells 71 to 74 are initially arranged in the scribe area. Here, each of the cells 71 to 73 is a single cell, and the cell 74 is a group cell. The size (axial length) of the group cell is 4000 μm. The condition of the arrangement space for each of the single cells 71 to 73 is 2000 μm or more, and the condition of the arrangement space for the single cells 71 to 73 and the group cell 74 is 50 μm or more. In the initial arrangement, the group cell 74 is arranged between the single cells 71 and 72. Therefore, the arrangement space between the single cell 71 and single cell 72 is 4100 μm, and the arrangement space between the single cell 72 and single cell 73 is 2000 μm.

Figure 10B:
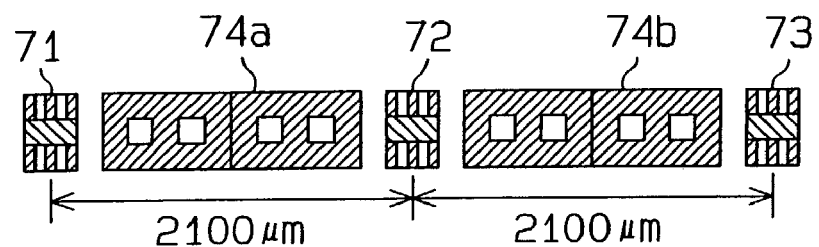

As shown in FIG. 10B, in the embedding processing, the group cell 74 is divided into two group cells 74a and 74b, and the group cell 74a is arranged between the single cells 71 and 72, and the group cell 74b is arranged between the single cells 72 and 73. This embedding processing reduces the arrangement space of the single cells 71 and 72 to 2100 μm and produces a free space, in which the unarranged cells can be embedded.

Next, the embedding processing by moving the already-arranged cells (already-arranged patterns) will be described.

As shown in FIG. 11A, single cells or group cells 81 to 85 are initially arranged in the scribe area (not shown). Cells 86 and 87 are embedded in the cells 81 to 85 initially arranged in this state. Here, the condition of the arrangement space between the cells 86 and 87 is set at d3.

As shown in FIG. 11B, it is determined whether or not there are arrangement areas for the cells 86 and 87 on the basis of the arrangement positions of the cells 81 to 85, and as a result, the cell 86 is arranged between the cells 81 and 82. Since the arrangement space d3 between the cell 86 and the cell 87 can not be retained at this stage, the cell 87 can not be placed.

Furthermore, as shown in FIGS. 11C and 11D, it is again determined whether or not there is an arrangement area for the cell 87 on the basis of the arrangement positions of the cells 81 to 85. As a result, since the arrangement area for the cell 87 can not be secured, the embedding processing of the cell 87 is performed by moving the already-arranged cells 81 to 85. In this embedding processing, it is possible to secure the space more than the arrangement space d3 between the cells 86 and 87, and the cells to be moved are selected so that the number of the already-arranged cells to be moved will be minimized. Here, as shown in FIG. 11E, the cell 82 is selected as the cell to be moved. As shown in FIG. 11F, the cell 82 is moved to the position which allows to obtain the minimum space between the cell 86 and cell 87 (indicated by an arrow in FIG. 11F). As the cell 82 is moved, the arrangement area for the cell 87 is provided. In this way, as shown in FIG. 11G, the cell 87 is placed between the cells 82 and 83 while keeping the arrangement space d3 between the cells 86 and 87 or more.

Next, the spec down processing will be described. First, the spec down processing related to the arrangement positions will be described.

Figure 12A:
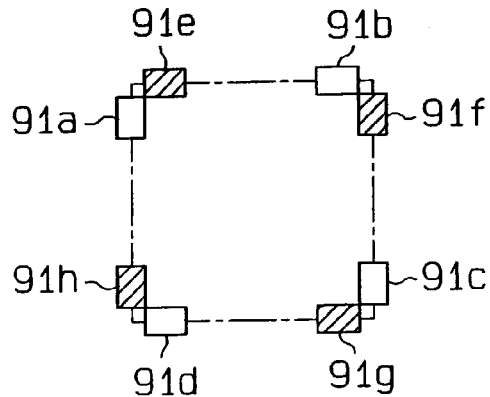
FIGS. 12A to 12D are diagrams for describing spec down processing of arrangement positions.
Figure 12B:
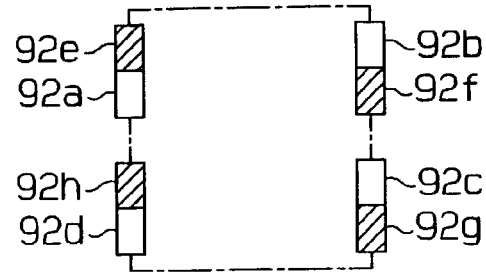
Figure 12C:
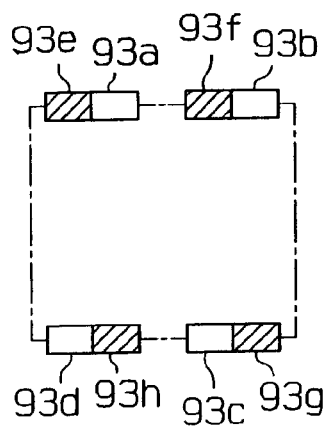
Figure 12D:
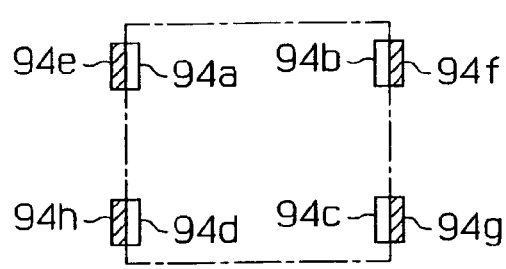

FIG. 12A shows arrangement positions corresponding to the highest in the order of priority (hereinafter, a first priority position), and FIGS. 12B to 12D show arrangement positions corresponding to the second to fourth in the order of priority (second to fourth priority positions) respectively. In each diagram, a dash and dotted line indicates the scribe line on the outer circumferential axis in the scribe area.

The cells that are replaced most preferentially in the spec down processing are cells (process patterns) 91a to 91d for which the arrangement limiting conditions to the first priority position are set. Light shielding bands 91e to 91h for preventing multiple exposure are formed on the sides opposite to the sides on which each of the cells 91a to 91d is arranged.

The cells that are replaced secondly preferentially are cells 92a to 92d for which the arrangement limiting conditions to the second priority position shown in FIG. 12B are set. The cells that are replaced thirdly preferentially are cells 93a to 93d for which the arrangement limiting conditions to the third priority position shown in FIG. 12C are set. The cells that are replaced least preferentially are cells 94a to 94d for which the arrangement limiting conditions to the fourth priority position shown in FIG. 12D are set.

Such order of priority is set so as to most preferentially replace the cells capable of being arranged in a position that enables the use by every exposure device and in every manufacturing process, or a position that enables the highest alignment accuracy to be obtained. Therefore, the order of priority becomes lower as the exposure devices and manufacturing processes that can be used become limited or the alignment accuracy becomes low. For example, in the arrangement position shown in FIG. 12D, because the arrangement areas of the cells occupying the scribe area increase and the number of chips to be obtained decreases, the priority of replacing the cells 94a to 94d in the spec down processing is the lowest.

Next, the spec down processing related to the pattern size will be described.

Figure 13:
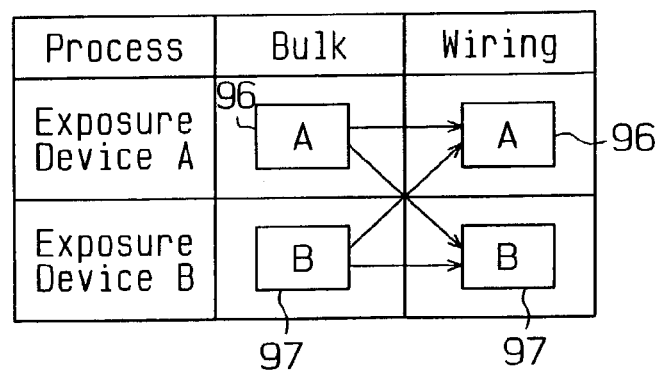
FIG. 13 is a diagram for describing exposure devices that can be used in each process.

As shown in FIG. 13, plural kinds (two kinds in the present embodiment) of exposure devices are used in each process (e.g., bulk process and wiring process) of the wafer process. There are four use patterns A→A, A→B, B→A and B→B of exposure devices 96 and 97 (indicated by A and B in FIG. 13) in the bulk process and wiring process.

The use patterns of the exposure devices 96 and 97 are appropriately selected in accordance with a mass production process and the operation rate of the apparatus. Therefore, it is desirable to form process patterns compatible with both of the exposure devices 96 and 97 (i.e., any of the four kinds of use patterns can be selected) in the bulk process and wiring process.

As shown in FIG. 14, a cell 98 indicating a process pattern shape (mark) that is formed on the photomask usable in the exposure device 96 includes at least one of the two patterns 98a and 98b. A cell 99 indicating a process pattern shape (mark) usable in the exposure device 97 includes at least one of two patterns 99a and 99b.

The pattern 98a of the cell 98 can be used in the bulk process, and the pattern 98b can be used in the wiring process. The pattern 99a of the cell 99 can be used in the bulk process, and the pattern 99b can be used in the wiring process.

The kind of pattern that the exposure devices 96 and 97 can use in the bulk process and wiring process is decided according to the combination of the patterns 98a and 98b of the cell 98 and the combination of the patterns 99a and 99b of the cell 99. In the spec down processing, the cell 98 including the patterns 98a and 98b and the cell 99 including the patterns 99a and 99b are replaced most preferentially. The cell 98 including only one of the patterns 98a and 98b and the cell 99 including only one of the patterns 99a and 99b are replaced least preferentially.

For example, in a pattern (a) of FIG. 14, the photomask is formed using the patterns 98a and 98b of the cell 98 and the patterns 99a and 99b of the cell 99. Therefore, both of the exposure devices 96 and 97 can use this photomask in the bulk process and wiring process. That is, any of the four use patterns (A→A, A→B, B→A and B→B) of the exposure devices 96 and 97 can be selected.

On the contrary, in a pattern (g) of FIG. 14, the photomask is formed using the pattern 98a of the cell 98 and the pattern 99a of the cell 99. Therefore, the exposure device 97 can use the photomask only in the bulk process, and the exposure device 96 can use the photomask only in the wiring process. In other words, only one use pattern (B→A) of the exposure devices 96 and 97 can be selected.

The pattern preparing apparatus 11 in the present embodiment has the following advantages.

(1) The pattern preparing apparatus 11 prepares the libraries of the cell shape data 17a, cell attribution data 17b and arrangement limiting conditions data 17c. The pattern preparing apparatus 11 selects a cell having the process pattern suitable for the process specification data 16a from the libraries, to prepare the layout data. Therefore, it is not necessary to prepare many arrangement models of the process patterns, so that the number of processes of preparing the layout data is reduced and so that a turn around time (TAT) of layout data preparation processing is shortened. As a result, the photomasks are prepared in a short period of time.

(2) As to the initial arrangement of the pattern preparation processing (step 15), the cells are sequentially arranged in accordance with the arrangement priority set on the basis of the arrangement importance and arrangement limiting conditions of the cells. Therefore, the process patterns are properly arranged.

(3) The embedding processing (step 17) is executed prior to the spec down processing (step 19). Therefore, the patterns are arranged effectively using the scribe area. In addition, the spec down processing, which does not need to be performed under normal circumstances, is prevented from being performed in an excessive way.

(4) The spec down processing (step 17) is performed in accordance with the order of priority set on the basis of the arrangement importance and arrangement limiting conditions of the cells. Therefore, the kind of process patterns is properly selected.

It should be apparent to those skilled in the art that the present invention may be embodied in many other specific forms without departing from the spirit or scope of the invention. Particularly, it should be understood that the invention may be embodied in the following forms.

Although the libraries are prepared when the layout data is prepared in accordance with a new design rule in the pattern preparation processing, the libraries may be prepared appropriately.

When the place to arrange the cells (process patterns) is not limited to the scribe area in the arrangement limiting conditions shown in FIG. 6, the first axis code 41 may be set as "no code".

In FIG. 6, "no code" may be set by not setting the data of the second and third axis codes 42, 43 and the place code 44.

In the embedding processing, dividing the unarranged cell may be carried out to arrange them as well as dividing the already-arranged cell 74 in FIG. 10 is carried out.

Therefore, the present examples and embodiments are to be considered as illustrative and not restrictive and the invention is not to be limited to the details given herein, but may be modified within the scope and equivalence of the Appended claims.

What is claimed is:

1. A method of preparing layout data of patterns formed in a scribe area, the method comprising:
    preparing library data on which a plurality of patterns and an arrangement limiting condition, a pattern attribution, and a size of each pattern are registered;
    selecting a pattern to be arranged in the scribe area from the library data;
    setting an order of priority of pattern arrangement position on the basis of the arrangement limiting condition and the pattern attribution of each pattern;
    arranging the selected pattern in the scribe area, in accordance with the order of priority;
    determining whether all the selected patterns can be arranged in the scribe area;
    when an unarranged pattern exists, embedding the unarranged pattern in a free area except the areas of already arranged patterns;
    determining whether all the selected patterns can be arranged in the scribe area after the embedding; and
    when an unarranged pattern exists, performing spec down processing for changing at least one of the arrangement limiting condition or the pattern size of the unarranged pattern.

2. The method according to claim 1, wherein the pattern attribution of each pattern includes arrangement importance of each pattern.

3. The method according to claim 1, wherein selecting the pattern includes selecting the pattern to be arranged in the scribe area from the library data in accordance with a preparation process condition of the layout data.

4. The method according to claim 1, wherein embedding includes moving at least one already-arranged pattern to form the free area.

5. The method according to claim 1, wherein embedding includes moving at least one already-arranged pattern to form the free area so that a space between the embedded unarranged pattern and the already-arranged patterns is minimized.

6. The method according to claim 1, wherein embedding includes dividing at least one already-arranged pattern and arranging the divided already-arranged pattern to form the free area.

7. The method according to claim 6, wherein at least one already-arranged pattern includes a group pattern comprising a plurality of dividable patterns.

8. The method according to claim 1, wherein embedding includes dividing the unarranged pattern and embedding the divided unarranged pattern in the free area.

9. The method according to claim 8, wherein the unarranged pattern includes a group pattern comprising a plurality of dividable patterns.

10. The method according to claim 1, wherein the unarranged pattern includes a plurality of sub patterns, and performing spec down processing includes decreasing the number of a plurality of sub patterns of the unarranged pattern to change the size of the pattern.

11. The method according to claim 1, wherein said performing spec down processing includes changing the arrangement position of the unarranged pattern in accordance with the order of priority.

12. The method according to claim 1, wherein the patterns of the layout data are transferred on a substrate by a plurality of shot exposures including a first shot exposure and a second shot exposure using an exposure device, the second shot exposure is performed to partially overlap the first shot exposure, and arranging the selected pattern in the scribe area includes:
arranging the selected pattern in the scribe area so that the pattern of the layout data transferred by the first shot exposure and the pattern of the layout data transferred by the second shot exposure are arranged to keep a predetermined space between the patterns.

13. A program for preparing layout data of patterns formed in a scribe area, the program causing a processing unit to:
prepare library data on which a plurality of patterns and an arrangement limiting condition, a pattern attribution, and a size of each pattern are registered;
select a pattern to be arranged in the scribe area from the library data;
set an order of priority of pattern arrangement position on the basis of the arrangement limiting condition and the pattern attribution of each pattern;
arrange the selected pattern in the scribe area, in accordance with the order of priority;
determine whether all the selected patters can be arranged in the scribe area;
when an unarranged pattern exists, embed the unarranged pattern in a free area except the areas of already-arranged patterns;
determine whether all the selected patterns can be arranged in the scribe area after the embedding; and
when an unarranged pattern exists, perform spec down processing for changing at least one of the arrangement limiting condition or the pattern size of the unarranged pattern.

14. The program according to claim 13, wherein the pattern attribution of each pattern includes arrangement importance of each pattern.

15. The program according to claim 13, wherein selecting the pattern includes selecting the pattern to be arranged in the scribe area from the library data in accordance with a preparation process condition of the layout data.

16. An apparatus for preparing layout data of patterns formed in a scribe area, comprising:
a processing unit that prepares library data on which a plurality of patterns and an arrangement limiting condition, a pattern attribution, and a size of each pattern are registered; and
a memory unit coupled to the processing unit that stores the library data,
wherein the processing unit selects a pattern to be arranged in the scribe area from the library data and sets an order of priority of pattern arrangement position on the basis of the arrangement limiting condition and the pattern attribution of each pattern, and
wherein the processing unit arranges the selected pattern in the scribe area, in accordance with the order of priority,
wherein the processing unit determines whether all the selected patterns can be arranged in the scribe area and, when an unarranged pattern exists, embeds the unarranged pattern in a free area except the areas of already-arranged patterns, and
wherein the processing unit determines whether all the selected patterns can be arranged in the scribe area after the embedding and, when an unarranged pattern exists, performs spec down processing for changing at least one of the arrangement limiting condition or the pattern size of the unarranged pattern.

17. The apparatus according to claim 16, wherein the pattern attribution of each pattern includes arrangement importance of each pattern.

18. The apparatus according to claim 16, wherein the processing unit selects a pattern to be arranged in the scribe area from the library data in accordance with a preparation process condition of the layout data.

19. The apparatus according to claim 16, wherein the patterns of the layout data are transferred on a substrate by a plurality of shot exposures including a first shot exposure and a second shot exposure using an exposure device, the second shot exposure is performed to partially overlap the first shot exposure, the processing unit arranges the selected pattern in the scribe area so that the pattern of the layout data transferred by the first shot exposure, and the pattern of the layout data transferred by the second shot exposure are arranged to keep a predetermined space between the patterns.

20. A method for preparing a photomask used in exposure of patterns, the method comprising:
preparing library data on which a plurality of patterns and an arrangement limiting condition, a pattern attribution, and a size of each pattern are registered;
selecting a pattern to be arranged in a scribe area from the library data;
setting an order of priority of pattern arrangement position on the basis of the arrangement limiting condition and the pattern attribution of each pattern;
arranging the selected pattern in the scribe area to prepare layout data, in accordance with the order of priority;
determining whether all the selected patterns can be arranged in the scribe area;
when an unarranged pattern exists, embedding the unarranged pattern in a free area except the areas of already-arranged patterns;
determining whether all the selected patterns can be arranged in the scribe area after the embedding;
when an unarranged pattern exists, performing spec down processing for changing at least one of the arrangement limiting condition or the pattern size of the unarranged pattern; and
preparing the photomask using the layout data.

* * * * *

UNITED STATES PATENT AND TRADEMARK OFFICE
CERTIFICATE OF CORRECTION

| | |
|---|---|
| PATENT NO. | : 7,062,747 B2 |
| APPLICATION NO. | : 10/330307 |
| DATED | : June 13, 2006 |
| INVENTOR(S) | : Yukisada Horie et al. |

It is certified that error appears in the above-identified patent and that said Letters Patent is hereby corrected as shown below:

Title Page Column 1 (Title), change "METHOD AND APPARATUS FOR PREPAREING PATTERNS USED FOR MANUFACTURE OF SEMICONDUCTOR DEVICE" to --METHOD AND APPARATUS FOR PREPARING PATTERNS USED FOR MANUFACTURE OF SEMICONDUCTOR DEVICE--.

Column 14, Line 17-18, change "already arranged" to --already-arranged--.

Column 15, Line 22, change "patters" to --patterns--.

Signed and Sealed this

Thirteenth Day of March, 2007

JON W. DUDAS
*Director of the United States Patent and Trademark Office*